(12) United States Patent
Adderly et al.

(10) Patent No.: US 9,196,519 B2
(45) Date of Patent: Nov. 24, 2015

(54) ACHIEVING UNIFORM CAPACITANCE BETWEEN AN ELECTROSTATIC CHUCK AND A SEMICONDUCTOR WAFER

(71) Applicant: International Business Machines Corporation, Armonk, NY (US)

(72) Inventors: Shawn A. Adderly, Essex Junction, VT (US); Jeffrey P. Gambino, Westford, VT (US); William J. Murphy, Ferrisburgh, VT (US); Jonathan D. Chapple-Sokol, Burlington, VT (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 132 days.

(21) Appl. No.: 14/085,969

(22) Filed: Nov. 21, 2013

(65) Prior Publication Data

US 2015/0138686 A1    May 21, 2015

(51) Int. Cl.
*H01L 21/683*     (2006.01)
*H01T 23/00*      (2006.01)

(52) U.S. Cl.
CPC .................................. *H01L 21/6833* (2013.01)

(58) Field of Classification Search
CPC .......................... H01L 21/6833; H01L 21/6831
USPC ............................................................ 361/234
See application file for complete search history.

(56) References Cited

U.S. PATENT DOCUMENTS

| | | | |
|---|---|---|---|
| 6,744,250 B2 | 6/2004 | Hauenstein | |
| 6,884,717 B1 | 4/2005 | Desalvo et al. | |
| 7,456,094 B2 | 11/2008 | Ma et al. | |
| 7,682,876 B2 | 3/2010 | Lu et al. | |
| 7,897,484 B2 | 3/2011 | Kar-Roy et al. | |
| 7,948,064 B2 | 5/2011 | Barth et al. | |
| 7,948,735 B2 * | 5/2011 | Nobori et al. | 361/234 |
| 2012/0126396 A1 | 5/2012 | Zhao et al. | |
| 2013/0115736 A1 | 5/2013 | Brunner et al. | |

OTHER PUBLICATIONS

Barakat et al., "Performance of a 0.13 μm SOI integrated 60 GHz dipole antenna", 1-4244-0878-4/07 © 2007 IEEE, pp. 2526-2529.
Gambino, et al., "Interconnect Processes and Reliability for RF Technology", IBM Microelectronics, 18th IEEE International Symposium on the Physical and Failure Analysis of Integrated Circuits (IPFA), 2011, 11 pages.

* cited by examiner

*Primary Examiner* — Dharti Patel
(74) *Attorney, Agent, or Firm* — David Cain; Hoffman Warnick LLC

(57) ABSTRACT

Embodiments of the present invention provide a method for achieving uniform capacitance between a semiconductor wafer and an electrostatic chuck. In certain embodiments, the method comprises the step of forming a layer on a first side of the semiconductor wafer, wherein the layer has a specified resistivity. The method further comprises placing the semiconductor wafer on the electrostatic chuck, wherein the layer contacts the electrostatic chuck. The method further comprises applying a radio frequency signal to the electrostatic chuck, and processing a second side of the semiconductor wafer.

20 Claims, 2 Drawing Sheets

US 9,196,519 B2

ACHIEVING UNIFORM CAPACITANCE BETWEEN AN ELECTROSTATIC CHUCK AND A SEMICONDUCTOR WAFER

FIELD OF THE INVENTION

This disclosure relates generally to semiconductor fabrication and more specifically to achieving uniform capacitance between an electrostatic chuck and a semiconductor wafer during semiconductor fabrication.

BACKGROUND OF THE INVENTION

The fabrication of semiconductor devices involves forming electronic components in and on semiconductor substrates, such as silicon wafers. These electronic components may include conductive layers, insulation layers, and/or implanted dopants, which are used to achieve specific electrical properties.

The fabrication process includes etching of the wafer to remove material therein. Wet etching involves applying chemicals, such as buffered hydrofluoric acid, to the wafer in order to react with the substrate and facilitate the etching process. Plasma etching, also referred to as "dry etching," uses a source gas of charged particles in an applied electric field to accelerate the charged particles toward the wafer. The charged particles may either react chemically with the wafer material (substrate) to etch the substrate, or the physical collisions between the charged particles and the wafer can sputter substrate atoms from the surface of the wafer, resulting in etching.

Reactive-ion etching is a type of plasma etching. In a reactive-ion etching tool, the semiconductor wafer is placed on a charged surface, called a chuck, which electrostatically clamps the wafer in place. The chuck also serves as a heat sink for the system. As the charged particles in the plasma react with the substrate, heat is generated and transferred away from the wafer using a cooling gas, such as helium, which flows through channels carved into the surface of the chuck. As a result, the capacitive coupling between the chuck and the wafer is not constant, which can lead to complications in the etching process.

SUMMARY

Embodiments of the present invention provide a method for achieving uniform capacitance between a semiconductor wafer and an electrostatic chuck. In certain embodiments, the method comprises forming a layer on a first side of the semiconductor wafer, wherein the layer has a specified resistivity. The method further comprises placing the semiconductor wafer on the electrostatic chuck, wherein the layer contacts the electrostatic chuck. The method further comprises applying a radio frequency signal to the electrostatic chuck, and processing a second side of the semiconductor wafer.

DETAILED DESCRIPTION

Figure 1:
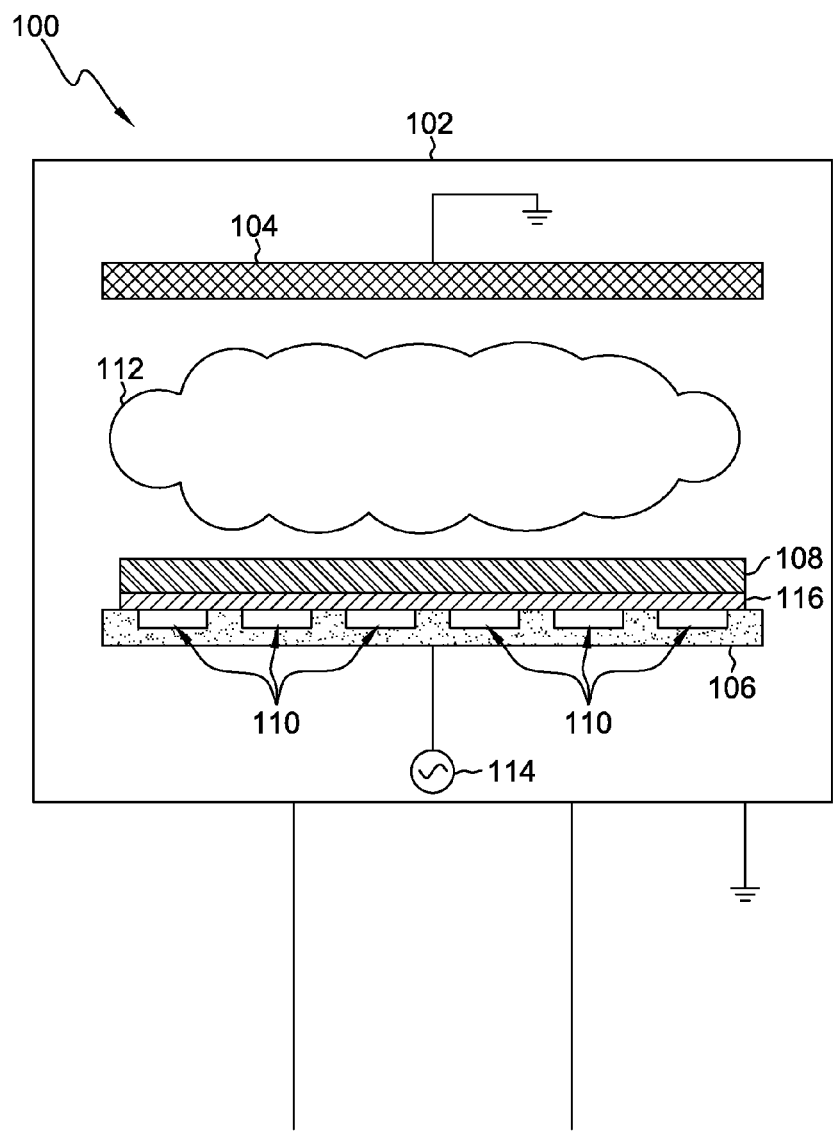
FIG. 1 depicts a reactive ion etching tool having a semiconductor wafer placed on the electrostatic chuck, in accordance with an embodiment of the present invention.

Detailed embodiments of the claimed structures and methods are disclosed herein. The method steps described below do not form a complete process flow for manufacturing integrated circuits. The present embodiments can be practiced in conjunction with the integrated circuit fabrication techniques currently used in the art, and only so much of the commonly practiced process steps are included as are necessary for an understanding of the described embodiments. The figures represent cross-section portions of a semiconductor chip or a substrate during fabrication and are not drawn to scale, but instead are drawn to illustrate the features of the described embodiments. Specific structural and functional details disclosed herein are not to be interpreted as limiting, but merely as a representative basis for teaching one skilled in the art to variously employ the methods and structures of the present disclosure.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "over", "on", "positioned on" or "positioned atop" mean that a first element is present on a second element wherein intervening elements, such as an interface structure, may be present between the first element and the second element. The term "direct contact" means that a first element and a second element are connected without any intermediary conducting, insulating or semiconductor layers at the interface of the two elements.

Sequential steps of an exemplary embodiment of a method for achieving uniform capacitance between an electrostatic chuck and a semiconductor wafer are described below with respect to the schematic illustrations of FIGS. 1-3. Similar reference numerals denote similar features.

FIG. 1 depicts a reactive ion etching tool, generally 100, in accordance with an embodiment of the present invention. Specifically, reactive-ion etching tool 100 includes vacuum chamber 102. Vacuum chamber 102 includes electrostatic chuck 106, upper electrode plate 104, electrostatic chuck 106 having cooling channels 110 formed on the surface thereof, semiconductor wafer 108 having coupling layer 116 formed thereon, and plasma 112. Vacuum chamber 102 includes a suitable gas, such as nitrogen trifluoride, at a low pressure for generating plasma 112 to facilitate the etching process.

Electrostatic chuck 106 is located below and parallel to upper electrode plate 104. Electrostatic chuck 106 is configured to connect to radio frequency (RF) signal generator 114. Electrostatic chuck 106 is electrically isolated from the rest of the components in vacuum chamber 102. During fabrication, semiconductor wafer 108 is placed on top of electrostatic chuck 106 and requires a DC voltage to be electrostatically coupled therewith. Electrostatic chuck 106 includes cooling channels 110 that are formed on a surface of electrostatic chuck 106, which allow for the flow of a coolant, such as helium gas, to prevent electrostatic chuck 106 or semiconductor wafer 108 from overheating.

Located between upper electrode plate 104 and semiconductor wafer 108, vacuum chamber 102 contains plasma 112 that is used to etch semiconductor wafer 108. Reactive-ion etching tool 100 converts gas into plasma 112 by applying a RF electromagnetic field to electrostatic chuck 106. The oscillating electric field ionizes the gas molecules by stripping them of electrons, which creates plasma 112. Subsequently, the RF field created by RF signal generator 114 accelerates charged particles in the plasma toward semiconductor wafer 108. Collisions between the charged particles and semiconductor wafer 108 strip electrons from semiconductor wafer 108 and add electrons to plasma 112. Collisions between free electrons and atoms in plasma 112 strip electrons from the atoms, which results in plasma 112 acquiring a positive potential. The free electrons collide with vacuum chamber 102 and feed into ground. Semiconductor wafer 108 and electrostatic chuck 106 attract ions during the negative RF cycle and electrons during the positive RF cycle. The electrons are less massive than the ions in plasma 112 and therefore move more freely in the applied RF field. The applied RF field causes semiconductor wafer 108 to attract electrons, resulting in a net negative bias on semiconductor wafer 108. The plasma 112 acquires a slightly positive potential. As the number of electrons in plasma 112 increases, nuclei in the plasma form positive ions due to increased atom-electron collisions. The positive ions are attracted to semiconductor wafer 108, which is negatively charged. The positive ions in plasma 112 either chemically react with semiconductor wafer 108 or sputter atoms from the surface of semiconductor wafer 108 in order to etch semiconductor wafer 108. In addition to the plasma production, electrons generate radicals from the gas environment. These radicals adsorb on the semiconductor wafer 108 reacting with it. By-products are liberated by desorption from the surface and pumped away.

Coupling layer 116 is located between semiconductor wafer 108 and electrostatic chuck 106. In one embodiment, coupling layer 116 is a film or metal layer formed on the side of semiconductor wafer 108 that contacts electrostatic chuck 106. Coupling layer 116 can be formed by conventional processes, such as chemical vapor deposition or physical vapor deposition. When formed, coupling layer 116 creates uniform capacitance between semiconductor wafer 108 and electrostatic chuck 106, which creates a uniform voltage drop across the boundary between semiconductor wafer 108 and electrostatic chuck 106. In one embodiment, coupling layer 116 is made of one or more metals such as aluminum or tungsten. In another embodiment, coupling layer 116 is made of one or more refractory materials such as tantalum nitride, titanium nitride, or tungsten nitride.

Figure 2:
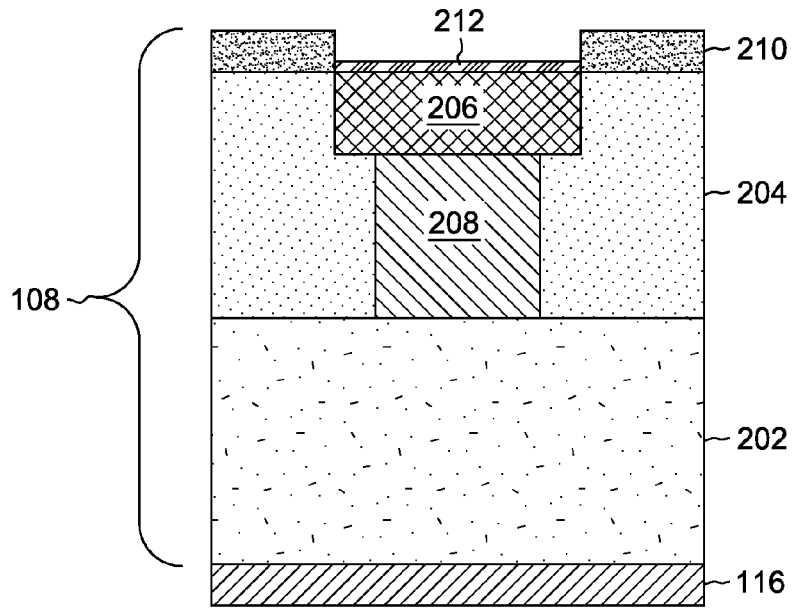
FIG. 2 depicts a film or metal layer deposited onto the backside of a semiconductor wafer, in accordance with an embodiment of the present invention.

FIG. 2 depicts the semiconductor wafer of FIG. 1, in accordance with an embodiment of the present invention. Semiconductor wafer 108 includes bulk substrate 202. In an embodiment, bulk substrate 202 includes crystalline material, such as silicon (Si), single crystal Si, silicon germanium (SiGe), and/or single crystal SiGe. In other embodiments, bulk substrate 202 also includes other semiconductor materials, such as Ge and compound semiconductor substrates, such as type III/V semiconductor substrates (e.g. gallium arsenide (GaAs)).

Front end of line (FEOL) layer 204 is formed on bulk substrate 202 using conventional processes, such as chemical vapor deposition or physical vapor deposition. In an embodiment, FEOL layer 204 includes a semiconductor substrate having formed therein electrical components using conventional methods of microelectronic fabrication.

In an embodiment, FEOL layer 204 includes bond pad 206 and bulk substrate interconnect 208, which are formed on bulk substrate 202 using conventional methods, such as chemical vapor deposition or physical vapor deposition. Bond pads electrically connect the components that are fabricated on bulk substrate 202 during the FEOL stage of fabrication. Bond pad 206 can be comprised of a conducting substance such as aluminum alloy, copper, or gold. As depicted in FIG. 2, bond pad 206 electrically connects to bulk substrate interconnect 208. Bulk substrate interconnect 208 electrically connects to bulk substrate 202. As one of skill in the art will appreciate, it is often beneficial to electrically connect a bond pad to a bulk substrate, for example, to provide a ground to the circuit.

Passivation layer 210 is formed by conventional methods, such as chemical vapor deposition over FEOL layer 204. As one of skill in the art will appreciate, passivation layer 210 can be comprised of a substance which hermetically seals components contained in FEOL layer 204, such as silicon nitride, to prevent harm to the components from environmental factors such as air or water.

Oxide layer 212 covers the exposed surface of bond pad 206 and comprises an oxidized metal, such as $Al_2O_3$. Oxide layer 212 facilitates the bond between bond pad 206 and electrical connections which are applied during the back end of line (BEOL) process.

In the embodiment depicted in FIG. 2, coupling layer 116 is formed on bulk substrate 202 by conventional deposition processes, such as chemical vapor deposition or physical vapor deposition. In an embodiment, coupling layer 116 includes material, such as film or metal, that has a melting point high enough to chemically withstand wet etching procedures to be performed on substrate wafer 108, and adheres to the backside of substrate wafer 108. Examples of coupling layers compatible with Si substrate include titanium nitride (TiN), aluminum, and tungsten. Coupling layer 116 ensures a flat conducting surface between semiconductor wafer 108 and electrostatic chuck 106. Coupling layer 116 generates a uniform voltage drop between semiconductor wafer 108 and electrostatic chuck 106 by reducing any variance in the capacitance between semiconductor wafer 108 and electrostatic chuck 106 caused by cooling channels 110. In an embodiment, coupling layer 116 is removed from wafer 108 after BEOL processing and prior to packaging wafer 108 by conventional processes such as photoresist strip cleaning. In one embodiment, coupling layer 116 has a protective layer formed thereon. The protective layer is formed by conventional methods, such as chemical vapor deposition or physical vapor deposition, and can be made of one or more insulator material such as silicon nitride, silicon oxide, or aluminum oxide.

The addition of coupling layer 116 facilitates the etching process in reactive-ion etching tool 100 by creating a uniform voltage drop between wafer 108 and electrostatic chuck 106. In an embodiment, coupling layer 116 generates a uniform voltage drop in order to prevent electrical components that are directly connected to bulk substrate 202, such as bond pad 206, from attracting positive ions from plasma 112 and contaminating oxide layer 212 formed thereon. In another embodiment, the uniform voltage drop generated by coupling layer 116 facilitates uniform etching of semiconductor wafer 108 where the diameter of wafer 108 is greater than that of electrostatic chuck 106.

Figure 3:
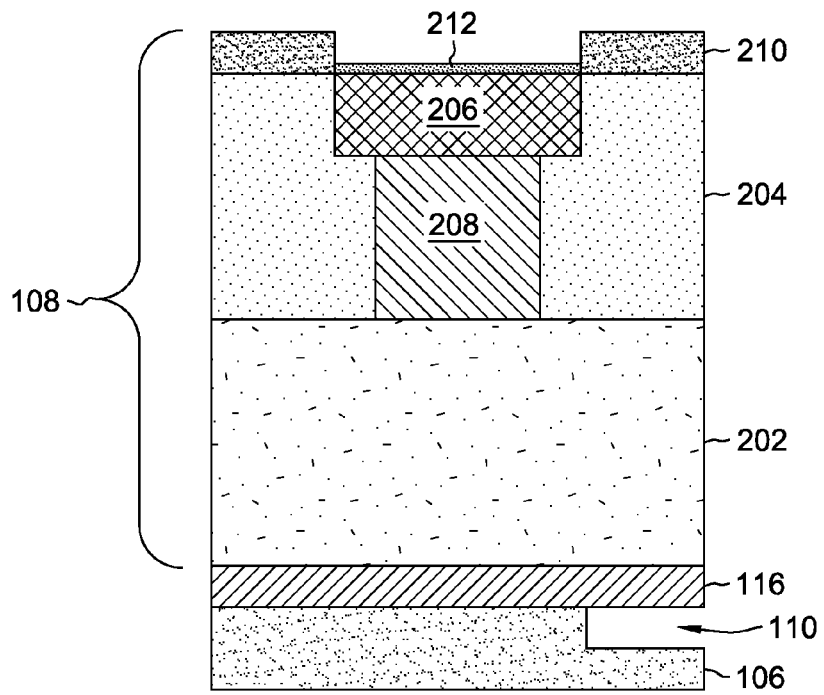
FIG. 3 depicts the semiconductor wafer having a backside film or metal layer placed on an electrostatic chuck, in accordance with an embodiment of the present invention.

FIG. 3 depicts the semiconductor wafer of FIG. 1, in accordance with an embodiment of the present invention. Semiconductor wafer 108, having coupling layer 116 applied to the backside thereof, is placed on electrostatic chuck 106. Electrostatic chuck 106 includes cooling channels 110 formed on the surface thereof. Electrostatic chuck 106 is biased at a high DC voltage to electrostatically clamp semiconductor wafer 108 to electrostatic chuck 106 and carries an RF signal to facilitate the reactive-ion etching process. Bulk substrate 202 also carries the RF signal because semiconductor wafer 108 is capacitively coupled to electrostatic chuck

106. As a result of the capacitive coupling between semiconductor wafer 108 and electrostatic chuck 106, a voltage drop occurs at the barrier between the two surfaces. Without coupling layer 116 in place, the voltage drop will not be uniform because of the change in capacitance between areas where semiconductor wafer 108 and electrostatic chuck 106 are in direct contact and areas were there is a gap between semiconductor wafer 108 and electrostatic chuck 106 because of cooling channel 110.

One challenge resulting from variable capacitance between semiconductor wafer 108 and electrostatic chuck 106 is the attraction of fluorine ions from plasma 112 to bond pad 206, which is coupled to bulk substrate 202 of semiconductor wafer 108. Because bond pad 206 is coupled to bulk substrate 202, it carries the same RF signal as electrostatic chuck 106 and bulk substrate 202. This RF signal attracts the positively charged fluorine ions in plasma 112. In an embodiment, coupling layer 116 achieves uniform capacitance between semiconductor wafer 108 and electrostatic chuck 106, which reduces the voltage drop between them and eliminates the over attraction of fluorine ions from plasma 112 to bond pad 206.

What is claimed is:

1. A method for achieving uniform capacitance between an electrostatic chuck and a semiconductor wafer comprising:
   forming a layer on a first side of the semiconductor wafer, wherein the layer has a specified resistivity;
   placing the semiconductor wafer on the electrostatic chuck, wherein the layer contacts the electrostatic chuck, and wherein at least a portion of the layer is positioned between the semiconductor layer and a cooling channel of the electrostatic chuck; and
   processing a second side of the semiconductor wafer.

2. The method of claim 1, wherein the layer comprises a material having a resistivity of less than 500 μΩcm.

3. The method of claim 1, wherein the layer is a metal.

4. The method of claim 1, wherein the layer is a refractory material.

5. The method of claim 1, wherein the layer comprises titanium nitride.

6. The method of claim 1, wherein the layer comprises aluminum.

7. The method of claim 1, wherein the layer comprises tungsten.

8. The method of claim 1, wherein the layer comprises tungsten nitride.

9. The method of claim 1, wherein the layer comprises tantalum nitride.

10. The method of claim 1, wherein the layer is formed after front end of line processing.

11. The method of claim 1, further comprising:
    removing the layer after processing the second side of the semiconductor wafer.

12. The method of claim 1, wherein the forming of the layer on the first side of the semiconductor wafer includes bonding the layer with the first side of the semiconductor layer, before placing the semiconductor layer on the electrostatic chuck.

13. The method of claim 1, wherein the semiconductor wafer has a first diameter, the electrostatic chuck has a second diameter, and the diameter of the semiconductor wafer is greater than the diameter of the electrostatic chuck.

14. The method of claim 1, further comprising forming a protective layer on the layer having the specified resistivity, wherein the protective layer comprises silicon-nitride.

15. The method of claim 1, further comprising forming a protective layer on the layer having the specified resistivity, wherein the protective layer comprises silicon oxide.

16. The method of claim 1, further comprising forming a protective layer on the layer having the specified resistivity, wherein the protective layer comprises aluminum oxide.

17. The method of claim 1, wherein the semiconductor wafer comprises a silicon on insulator substrate.

18. The method of claim 1, wherein processing the second side of the semiconductor wafer comprises:
    electrostatically coupling the semiconductor wafer to the electrostatic chuck; and
    applying a radio frequency signal to the electrostatic chuck.

19. A method for achieving uniform capacitance between an electrostatic chuck and a semiconductor wafer, the method comprising:
    forming a layer on a first side of the semiconductor wafer, wherein the semiconductor wafer includes at least one bond pad electrically coupled to a bulk substrate, and wherein the layer has a specified resistivity;
    placing the semiconductor wafer on the electrostatic chuck, wherein the layer contacts the electrostatic chuck;
    processing a second side of the semiconductor wafer.

20. A method for achieving uniform capacitance between an electrostatic chuck and a semiconductor wafer comprising:
    forming a layer on a first side of the semiconductor wafer, wherein the layer has a specified resistivity;
    forming a protective layer on the layer having the specified resistivity;
    placing the semiconductor wafer on the electrostatic chuck, wherein the layer contacts the electrostatic chuck; and
    processing a second side of the semiconductor wafer.

* * * * *